(12) United States Patent
Palm et al.

(10) Patent No.: US 6,909,294 B2
(45) Date of Patent: Jun. 21, 2005

(54) TIME RECORDING DEVICE AND A TIME RECORDING METHOD EMPLOYING A SEMICONDUCTOR ELEMENT

(75) Inventors: Herbert Palm, Höhenkirchen (DE); Hans Taddiken, München (DE); Erdmute Wohlrab, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/638,598

(22) Filed: Aug. 11, 2003

(65) Prior Publication Data

US 2004/0032244 A1 Feb. 19, 2004

Related U.S. Application Data

(63) Continuation of application No. PCT/EP02/01013, filed on Jan. 31, 2002.

(30) Foreign Application Priority Data

Feb. 23, 2001 (DE) .......................................... 101 08 913

(51) Int. Cl.[7] .......................... G01R 31/26; H01L 23/58
(52) U.S. Cl. .......................... 324/719; 324/763; 257/48
(58) Field of Search ........................ 324/519, 763–769; 368/79; 365/185, 200–204; 257/324, 48; 327/566

(56) References Cited

U.S. PATENT DOCUMENTS 5,463,579 A * 10/1995 Shimoji ................. 365/185.16
5,541,871 A * 7/1996 Nishimura et al. ......... 365/145
5,760,644 A * 6/1998 Lancaster et al. .......... 327/566
6,006,304 A * 12/1999 Mukai et al. ............... 711/103
6,040,996 A    3/2000 Kong
6,087,885 A * 7/2000 Tobita ....................... 327/379

FOREIGN PATENT DOCUMENTS

JP    04294292     10/1992
WO   01/17025 A3   3/2001

* cited by examiner

*Primary Examiner*—Anjan Deb
*Assistant Examiner*—M. Kramskaya
(74) *Attorney, Agent, or Firm*—Laurence A. Greenberg; Werner H. Stemer; Ralph E. Locher

(57) ABSTRACT

A time recording device employs a floating gate cell, wherein an ON layer structure or an ONO layer structure is provided between floating gate and control gate. A charge injection unit is provided to inject charges into the floating gate electrode and into the nitride layer of the ON structure or the ONO structure by applying a voltage or voltage pulses to the control gate electrode, a center of concentration of the charges injected into the nitride layer being located at the interface between oxide layer and nitride layer of the layer sequence. The time recording device also includes a unit for recording a time which has elapsed since charge injection on the basis of changes in the transmission behavior of the channel region caused by a shift in the center of concentration of the charges in the nitride layer away from the interface.

10 Claims, 3 Drawing Sheets

TIME RECORDING DEVICE AND A TIME RECORDING METHOD EMPLOYING A SEMICONDUCTOR ELEMENT

CROSS-REFERENCE TO RELATED APPLICATION

This application is a continuation of copending International Application No. PCT/EP02/01013, filed Jan. 31, 2002, which designated the United States and was not published in English.

BACKGROUND OF THE INVENTION

1. Field of the Invention

The present invention relates to time recording devices and methods and in particular to such time recording devices and methods which can be used to realize a currentless time normal, e.g. to permit a delay in the access time to a chip.

2. Description of Prior Art

Electronic circuits such as chipcard ICs are subject to a special requirement as regards rejecting unauthorized accesses. To prevent unauthorized accesses, electronic circuits which perform security functions, e.g. chipcard ICs, are secured by employing encryption methods. Such encryption methods can be investigated by addressing the electronic circuit with signal patterns which are changed only gradually, e.g. within the framework of a DPA (differential power analysis), the electronic circuit being switched on and off periodically in response to such attacks. A successful attack, which would make the electronic circuit or the chipcard IC vulnerable to an unauthorized access, requires a certain number of switchon events. This attack can be made more difficult or prevented by increasing the time between the switchon events or by permitting only a certain number of switchon events in a specified time interval.

To be able to take the above measures against unauthorized accesses, time recording must be provided on the electronic circuit or the chip, and this should preferably also operate in the switched-off state, i.e. without energy being supplied. In addition such time recording should be substantially temperature independent and be immune to external influences.

From U.S. Pat. No. 5,760,644 an integrated semiconductor circuit is known by means of which a time lapse can be recorded. According to U.S. Pat. No. 5,760,644 charge carriers are introduced for this purpose into a storage dielectric and changes in the electric field arising from the charge introduced into the dielectric are used for time recording. This electric field changes with increasing natural charge diminution in the dielectric material, so that measurement of the electric field with time provides information on the time which has elapsed. The storage dielectric used in U.S. Pat. No. 5,760,644 is the ONO structure (oxide-nitride-oxide structure) of an SONOS transistor (silicon-ONO-silicon transistor) or the NO structure (nitride-oxide structure) of an SNOS transistor (silicon-NO-silicon transistor). Using the ONO dielectric or the NO dielectric of the above storage transistors, the time-dependent charge loss of the electrons stored in the nitride is established through the altered effective voltage of the cell.

SUMMARY OF THE INVENTION

It is the object of the present invention to provide a device and a method of time recording by means of which a time normal can be realized in a manner which is substantially independent of the temperature and which is not subject to external influences.

According to a first aspect of the invention, this object is achieved by a time recording device comprising:

a semiconductor element with a transistor structure, which includes source/drain regions and a channel region between the same, a gate dielectric arranged above the channel region, a floating gate electrode arranged above the gate dielectric, a layer sequence comprising an oxide layer arranged on the floating gate electrode and a nitride layer arranged on the oxide layer, the layer sequence being arranged above the floating gate electrode, and a control gate electrode arranged above the layer sequence;

a charge injection unit for injecting charges into the floating gate electrode and into the nitride layer by applying a voltage or voltage pulses to the control gate electrode, a centre of concentration of the charges injected into the nitride layer being located at the interface between oxide layer and nitride layer of the layer sequence; and a unit for recording a time which has elapsed since charge injection on the basis of changes in the transmission behaviour of the channel region caused by a shift in the centre of concentration of the charges in the nitride layer away from the interface.

According to a second aspect of the invention, this object is achieved by a method for recording an elapsed time, comprising the following steps:

applying a voltage or voltage pulses to the control gate electrode of a semiconductor element having a transistor structure, which includes source/drain regions; a channel region between the same; a gate dielectric arranged above the channel region; a floating gate electrode arranged above the gate dielectric; a layer sequence comprising an oxide layer arranged on the floating gate electrode and a nitride layer arranged on the oxide layer, the layer sequence being arranged above the floating gate electrode; and the control gate electrode arranged above the layer sequence, so as to inject charges into the floating gate electrode and into the nitride layer, a centre of concentration of the charges injected into the nitride layer being located at the interface between the oxide layer and the nitride layer of the layer sequence; and recording a time which has elapsed since charge injection on the basis of changes in the transmission behaviour of the channel region caused by a shift in the centre of concentration of the charges in the nitride layer away from the interface.

According to the present invention a time recording device comprises a semiconductor element with a transistor structure, e.g. in the form of an EEPROM cell. In such an EEPROM cell a gate dielectric is arranged over the channel region of the storage transistor and arranged above the dielectric there is a floating gate electrode, which is isolated from a control gate electrode by an NO layer sequence (nitride-oxide layer sequence) or an ONO layer sequence (oxide-nitride-oxide layer sequence).

According to the present invention, for the purposes of time recording or the realization of a time normal, charges are now injected into the floating gate electrode and from there into the nitride layer of the isolation between floating gate electrode and control gate electrode. After such an injection the centre of charge concentration of the charges injected into the nitride layer is located along the interface between the oxide layer facing the floating gate electrode and the nitride layer of the ON structure or the ONO structure between floating gate electrode and control gate electrode.

According to the present invention the displacement of the centre of charge concentration of these injected charges away from the interface is now used for the purposes of time recording, this displacement having an influence on the transmission behaviour of the channel region.

Depending on the types of doping used for the storage cell, electrons or holes can be injected into the ON layer sequence or the ONO layer sequence, the charge carriers being localized initially in the neighbourhood of their injection, i.e. in the nitride layer at the interface between the oxide layer facing the floating gate electrode and the nitride layer. Later these charge carriers begin to wander through the nitride due to a trap-supported conduction mechanism, known as hopping conduction, which results in a shift in the centre of charge concentration. This shift in the centre of charge concentration can now be established by a suitable method, based on changes in the transmission behaviour of the channel region of the storage cell, thus resulting in the desired time normal.

During normal operation of an EEPROM storage cell such as is used for time recording according to the present invention, charges for the storage of information are injected into the floating gate electrode. Charge injection into the ON isolation layer sequence or the ONO isolation layer sequence is here simply an undesirable side effect. According to the present invention this side effect is used for time measurement, this side effect increasing proportionately as more charges are injected into the EEPROM storage cell. This effect can be used for time recording by injecting a larger number of charges into a time measurement cell and a smaller number of charges into a reference cell. The quantity of charge injected into the time measurement cell must be sufficient to cause an injection of charges into the nitride layer. By employing such a reference cell the passage of a specified lapsed time can be registered in that the cut-off voltage of the reference cell and that of the time measurement cell have a specific relationship to one another after the appropriate charge carrier injections, e.g. have decreased to the same value. Here cut-off voltage is to be understood as the voltage which must be applied to the control gate in order to produce a specified current flow through the channel region of the respective cell.

BRIEF DESCRIPTION OF THE DRAWINGS

Preferred embodiments of the present invention are described in more detail below making reference to the enclosed drawings, in which.

DESCRIPTION OF PREFERRED
EMBODIMENTS OF THE INVENTION

Figure 2:
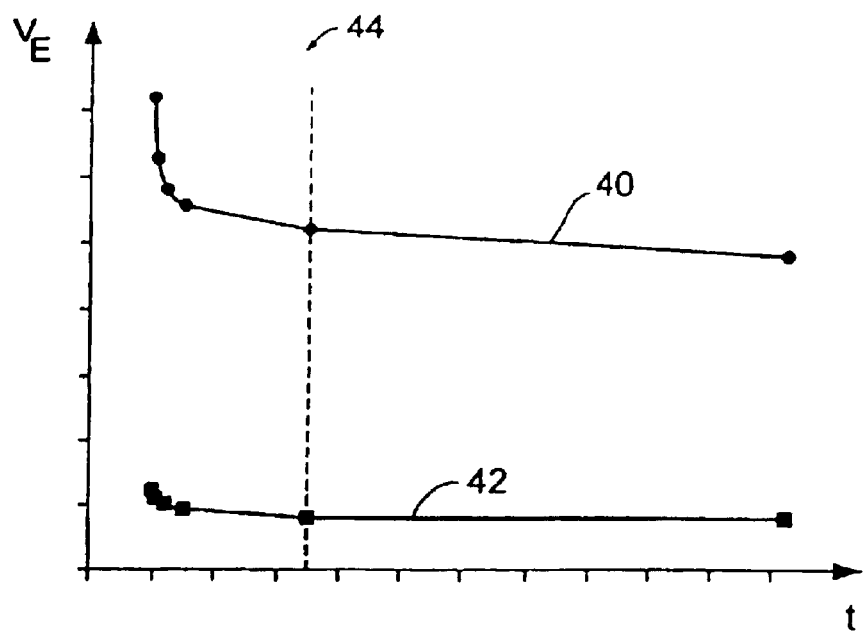
FIG. 2 shows in a diagram how the cut-off voltage $V_E$ varies with time for different values of the injection voltage.
Figure 3:
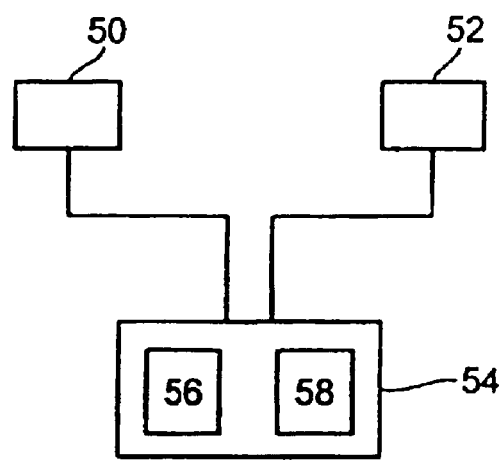
FIG. 3 shows a schematic representation of an embodiment of a time recording device according to the present invention.

Before giving a more detailed description of the effect on which time recording according to the present invention is based, i.e. a shift in the centre of charge concentration in the nitride layer of a semiconductor element with a transistor structure, which is an EEPROM storage cell in preferred embodiments of the present invention, making reference to FIGS. 2 and 3, the structure of such an EEPROM storage cell will first be outlined briefly.

Figure 1:
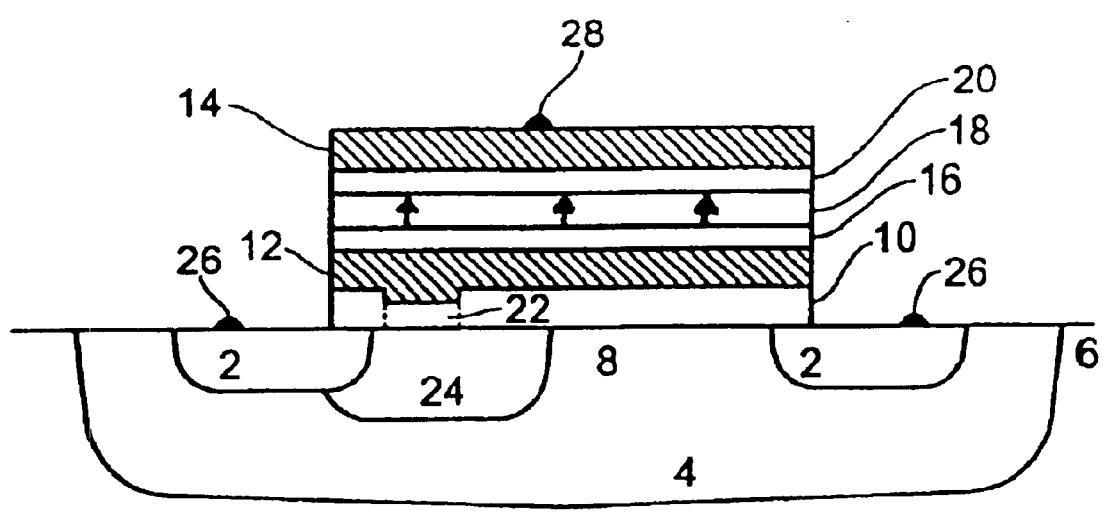
FIG. 1 shows a schematic representation of the structure of an EEPROM storage cell.

FIG. 1 shows a schematic cross-sectional view of such an EEPROM storage cell, wherein source/drain regions 2 are provided by suitable implantation in the doped well 4 of a semiconductor substrate 6. Above the channel region 8 of the storage cell located between the source/drain regions a gate oxide 10 is provided above which there is a floating gate electrode 12. Between the floating gate electrode 12 and a control gate electrode 14 there is an ONO layer sequence consisting of a lower oxide layer 16, a nitride layer 18 and an upper oxide layer 20.

The gate oxide 10, or the gate oxide layer, has a region 22 of reduced thickness, constituting a tunnel window. An injection implantation 24 is provided in the doped well 4 underneath the tunnel window 22. Finally, the source/drain regions are provided with their respective source/drain terminals 26 and the control gate electrode is provided with a control gate terminal 28.

The design of the EEPROM storage cell shown in FIG. 1, which is a FLOTOX storage cell (FLOTOX=FLOating gate tunnel oxide), can, as regards dimensioning, doping concentrations, programming and erasure voltages and the like, be chosen in close compatibility with traditional structures of a floating gate cell. It should be stressed at this point that apart from the cited FLOTOX cell other transistor structures having a floating gate, e.g. known flash cells in which electrons are brought to the floating gate by the injection of hot electrons, can also be used.

The logical state of the EEPROM storage cell in FIG. 1 when this is used for storage is determined by the charge state of the floating gate 12. In order to bring electrons to the floating gate electrode 12, i.e. to inject them into it, a suitable injection voltage is applied to the control gate terminal 28, thus resulting in Fowler-Nordheim tunnelling of charge carriers through the tunnel window 22 onto the floating gate electrode 12. The charges thus brought to the floating gate electrode 12 influence the transmission behaviour of the channel region 8, resulting in a change in the cut-off voltage $V_E$, i.e. the voltage needed at the control gate terminal 28 in order to achieve a specified channel current between the source/drain regions 2, which can be tapped off via the terminals 26. If the dopings and voltages are such that electrons are injected into the floating gate electrode 12, the cut-off voltage shifts to increasingly positive voltages as the number of charges on the floating gate electrode increases.

To read the storage cell, i.e. to record the logical state of the cell, a specified voltage is normally applied to the control gate electrode 28, the channel current then being a criterion for the logical state of the cell. The read level, i.e. the voltages to be applied to the control gate electrode so as to read out the cell, must be so chosen as to avoid any inadvertent partial programming of the cell, i.e. inadvertent change of charge of the cell due to a read operation, even after a plurality of read operations.

As was explained above, in normal operation charge carriers are injected into the floating gate electrode of the storage cell. However, when the injection voltage is high enough or a sufficient number of voltage pulses is used, there is, in addition to this injection of charge carriers into the floating gate electrode, also an injection of charge carriers through the lower oxide layer 16 into the nitride layer 18 due to a tunnel effect. The charge carriers thus injected into the nitride layer 18 are initially localized near to their place of injection, i.e. at the interface between lower oxide layer 16 and nitride layer 18. After completion of charge carrier injection and without application of an external voltage the centre of charge concentration shifts, as time passes, in the direction of the control gate electrode 14, mainly due to hopping mechanisms (Poole-Frenkel electron hopping). This shift mechanism is indicated in FIG. 1 by the arrows in the nitride layer 18 and it continues to act until the resulting field prevents the movement of any more charge carriers or electrons. The major part of the charges injected into the nitride is then to be found at the interface between nitride layer 18 and upper oxide layer 20.

The charge injected into the nitride layer 18 influences the channel behaviour of the cell, as does the charge injected into the floating gate 12. The closer these charges are to the channel 8 of the cell, the better they can counteract the inversion of the channel and thus the creation of a conducting channel. The proximity of the charges to the channel thus has a direct effect on the cut-off voltage of the transistor, or the storage cell. This cut-off voltage thus depends on the spatial position of the centre of charge concentration of the charges in the nitride. The closer this centre of concentration is to the control gate electrode 14 the higher the cut-off voltage of the cell.

Since the charge shift in the nitride layer 18 described above is time-dependent, it can be used for time recording, or to realize a time normal, by supervising the charge shift through observation of the cut-off voltage of the cell.

In FIG. 2 the cut-off voltages $V_E$ of an EEPROM cell such as has been described above are shown as a function of time. Curve 40 shows the cut-off voltage for injection voltages with large pulse height and curve 42 the cut-off voltage for injection voltages with smaller pulse height. Typical injection voltages, which result in a curve of type 40 for typical EEPROM cells, have e.g. a pulse height of 17 V, whereas injection voltages which result in a curve of type 42 have e.g. a pulse height of 14 V. The curves 40 and 42 were obtained using an EEPROM cell whose lower oxide layer 16 had a thickness of 5 nm and whose nitride layer 18 had a thickness of 20 nm.

The curves 40 and 42 of FIG. 2 show an cut-off voltage that decreases with time, it being possible to divide the loss in cut-off voltage into two phases. The first phase shows a rapid falling away of the cut-off voltage, after which there is a more gradual decrease in the cut-off voltage, the first phase ending in the vicinity of the dashed line 44 of FIG. 2. The rapid decrease in the first phase is caused by the charge shift in the nitride layer 16 described above, while leakage currents are responsible for the more gradual decrease in the second phase. The rapid decrease in the cut-off voltage in the first phase of the behaviour curves 40 and 42 are used for time recording according to the present invention. In this connection it can be seen from the curves 40 and 42 in FIG. 2 that this effect of a decrease in the cut-off voltage becomes increasingly prominent with increasing pulse height of the injection voltage. The reason for this is that the pulse height of the injection voltage used changes the relationship between the charge injected into the floating gate and the charge injected into the nitride layer. The greater the pulse height is, the greater is the fraction of the charge injected into the nitride layer. As the fraction of the charge which is injected into the nitride layer increases so also does the influence of the charge shift in the nitride layer on the profile of the cut-off voltage, as shown in FIG. 2.

It is clear that, according to the present invention, injection voltages must be used which, in addition to charge carrier tunnelling through the tunnel window 22, also cause tunnelling through the lower oxide layer 16 into the nitride layer 18. The magnitude of the injection voltages to be employed in practice depends on the particular design of the storage cell.

If appropriate injection voltages are used, time recording can be achieved quite simply on the basis of the change in the cut-off voltage resulting from the charge shift which has been described. An embodiment of the way the passage of a specified time can be recorded according to the present invention is described below making reference to FIG. 3. In this embodiment a time scale cell 50 and a reference cell 52 are used, both of which may e.g. take the form of a floating gate cell with an ONO structure as interpoly dielectric, i.e. as dielectric between floating gate and control gate, as has been described above. The time recording device employs a control unit 54 which has, on the one hand, a charge carrier injection unit 56, and on the other a unit 58 for recording the time which has elapsed since the injection of charges into such a floating gate cell. The control unit 54 is connected in a suitable way to the time scale cell 50 and the reference cell 52.

By means of a positive voltage pulse, which might e.g. have a height of 17 V, at the control gate the floating gate cells of the two cells 50 and 52 are charged up negatively, so that the cut-off voltages of the cells are positive, e.g. they might have a value of 4 V. The floating gate of the time scale cell is then further charged up negatively by means of one or more additional voltage pulses, e.g. to an cut-off voltage of 5 V. When there ceases to be a voltage on the cells, the stronger field in the time scale cell 50 causes its centre of charge concentration in the nitride layer to shift in such a way that the cut-off voltage of the cell sinks. Using further voltage pulses has much the same effect as using higher voltage pulses as far as the charge concentration between floating gate and nitride layer is concerned, so the change in the cut-off voltage due to charge shift is greater in the time scale cell than in the reference cell. The time which elapses until the cut-off voltage of the time scale cell again becomes equal to that of the reference cell, which can be established by comparing the cut-off voltages of the two cells, which is performed in the unit 58, then provides one possible time normal. When the time recording device according to the present invention is employed as the security mechanism against unauthorized accesses, the chip can then e.g. remain inoperative until it is established that a state has been reached where such coincidence exists between the cut-off voltages or where there is a specified ratio between the cut-off voltages.

Figure 4:
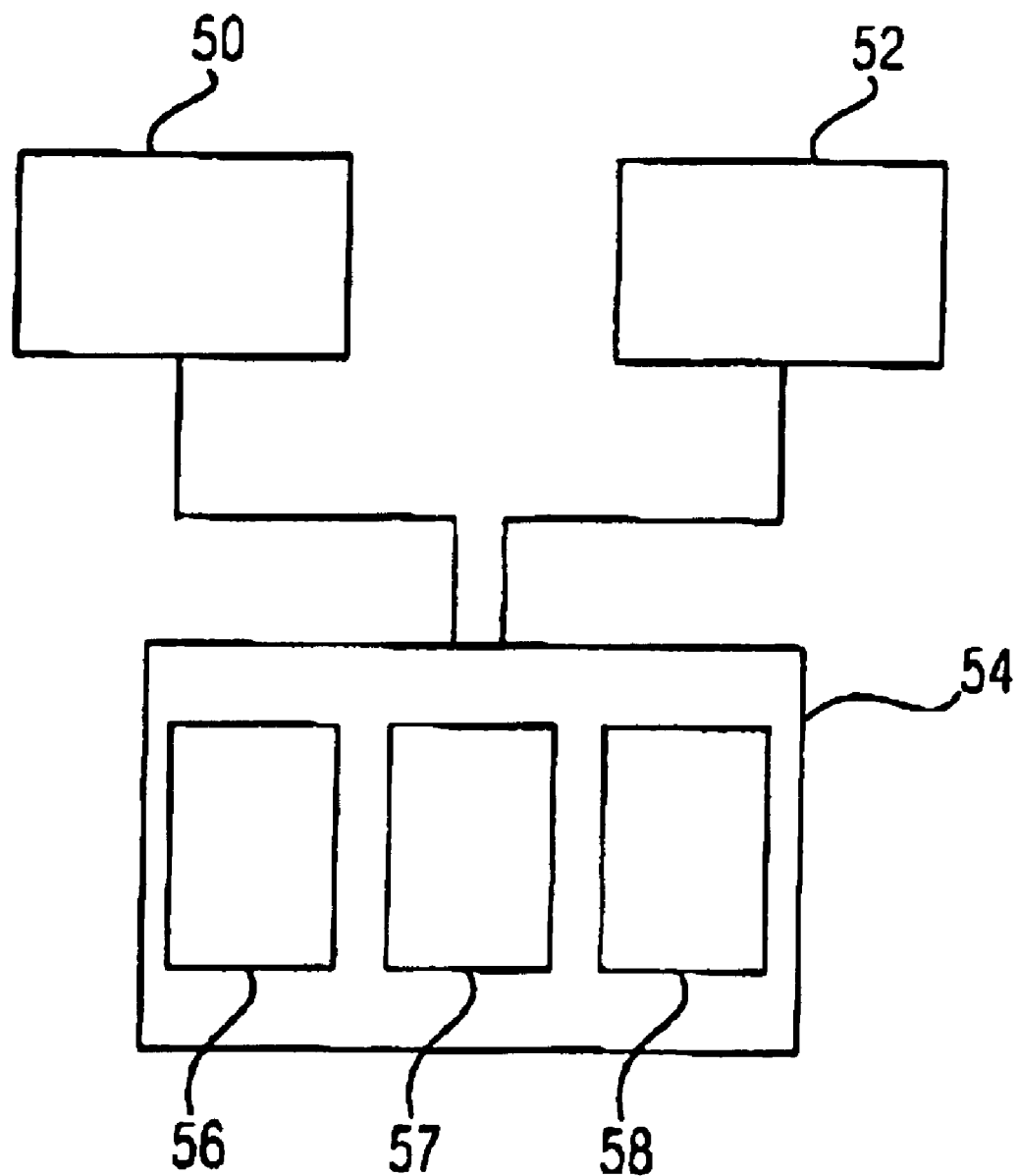
FIG. 4 shows a schematic representation of another embodiment of a time recording device according to the present invention.

A time recording device including a unit 57 for recording the voltage which must be applied to the control gate electrode of the time scale cell 50 and the reference cell 52 in order to cause a specific current flow through the channel region of the respective cell is shown in FIG. 4.

Consequently, according to the present invention a charge shift in an ON layer or an ONO layer is used as time normal, in contrast to known methods, e.g. that described in the U.S. Pat. No. 5,760,644, wherein a natural disappearance of the charges in the storage dielectric of a SONOS cell is used for time recording. With the present invention it is therefore possible to achieve higher resolution than in known methods since, as has been described above, a proportionally higher fall in the cut-off voltage, caused by the described charge shift, can be attained through the use of suitable injection voltage pulses. Furthermore, the present invention provides time measurement which is substantially independent of temperature and which is not subject to external influences.

In connection with the effect of charge shift in the nitride layer of an EEPROM cell which is exploited for time measurement in the present invention, reference is made to the dissertation of Herr Eric-Roger Brücklmeier "Untersuchungen zur Datenhaltung an FLOTOX-EEPROM-Zellen mit ONO als Interpolydielektrikum", date of submission May 1, 1998.

What is claimed is:

1. A time recording device comprising
    a time scale semiconductor element with a transistor structure including source/drain regions, a channel region between the source/drain regions, a gate dielectric arranged above the channel region, a floating gate electrode arranged above the gate dielectric, a layer sequence including an oxide layer arranged on the floating gate electrode and a nitride layer arranged on the oxide layer, the layer sequence being arranged above the floating gate electrode, and a control gate electrode arranged above the layer sequence;
    a charge injection unit for injecting charges into the floating gate electrode and into the nitride layer by applying a voltage or voltage pulses to the control gate electrode, a centre of concentration of the charges injected into the nitride layer being located at the interface between the oxide layer and the nitride layer of the layer sequence; and
    a unit for recording a time elapsed since charge injection on the basis of changes in the transmission behaviour of the channel region caused by a shift in the centre of concentration of the charges in the nitride layer away from the interface.

2. The time recording device according to claim 1, wherein the layer sequence has a further oxide layer arranged on the nitride layer.

3. The time recording device according to claim 1, further comprising a reference semiconductor element with exactly the same structure as the time scale semiconductor element, a unit for injecting charges into the floating gate electrode of the reference semiconductor element at the same time as charges are injected into the floating gate electrode and the nitride layer of the time scale semiconductor element being provided as well and the unit for recording the elapsed time having a unit for comparing the transmission behaviour of the channel regions of the time scale semiconductor element and the reference semiconductor element.

4. The time recording device according to claim 1, further comprising a unit for recording the voltage which must be applied to the control gate electrode in order to cause a specified current flow through the channel region of the time scale semiconductor element.

5. The time recording device according to claim 3, further comprising a unit for recording the voltage which must be applied to the control gate electrodes of the time scale semiconductor element and of the reference semiconductor element in order to cause a specified current flow through the respective channel region.

6. A method for recording an elapsed time, comprising the following steps:
    applying a voltage or voltage pulses to the control gate electrode of a time scale semiconductor element having a transistor structure, which includes source/drain regions; a channel region between the source/drain regions; a gate dielectric arranged above the channel region; a floating gate electrode arranged above the gate dielectric; a layer sequence comprising an oxide layer arranged on the floating gate electrode and a nitride layer arranged on the oxide layer, the layer sequence being arranged above the floating gate electrode; and the control gate electrode arranged above the layer sequence, so as to inject charges into the floating gate electrode and into the nitride layer, a centre of concentration of the charges injected into the nitride layer being located at the interface between the oxide layer and the nitride layer of the layer sequence; and
    recording a time which has elapsed since charge injection on the basis of changes in the transmission behaviour of the channel region caused by a shift in the centre of concentration of the charges in the nitride layer away from the interface.

7. The method according to claim 6, wherein the layer sequence of the time scale semiconductor element has a further oxide layer above the nitride layer.

8. The method according to claim 6, which further comprises the step of simultaneous injection of charges into the floating gate electrode of a reference semiconductor element, the structure of which is identical to that of the time scale semiconductor element, the transmission behaviour of the channel regions of the time scale semiconductor element and of the reference semiconductor element being compared in the step of recording the elapsed time.

9. The method according to claim 6, which further comprises the step of recording the voltage which must be applied to the control gate electrode in order to causes a specified current flow through the channel region.

10. The method according to claim 8, which further comprises the step of recording the voltage which must be applied to the control gate electrodes of the time scale semiconductor element and of the reference semiconductor element in order to cause a specified current flow through the respective channel region.

* * * * *